United States Patent
Einsla et al.

(10) Patent No.: US 8,313,973 B2
(45) Date of Patent: *Nov. 20, 2012

(54) METHOD FOR PRODUCING A PHOTOVOLTAIC MODULE

(75) Inventors: Melinda L. Einsla, Chalfont, PA (US); Edward C. Greer, Lower Gwynedd, PA (US); Hailan Guo, Warrington, PA (US)

(73) Assignee: Rohm and Haas Company, Philadelphia, PA (US)

( * ) Notice: Subject to any disclaimer, the term of this patent is extended or adjusted under 35 U.S.C. 154(b) by 65 days.

This patent is subject to a terminal disclaimer.

(21) Appl. No.: 13/004,121

(22) Filed: Jan. 11, 2011

(65) Prior Publication Data

US 2011/0171772 A1    Jul. 14, 2011

Related U.S. Application Data

(60) Provisional application No. 61/335,805, filed on Jan. 12, 2010.

(51) Int. Cl.
 *H01L 21/56* (2006.01)
(52) U.S. Cl. ............. 438/64; 257/E21.09; 257/E31.117
(58) Field of Classification Search ............ 438/64, 438/66; 257/E21.09, E31.117
See application file for complete search history.

(56) References Cited

U.S. PATENT DOCUMENTS

| | | | | |
|---|---|---|---|---|
| 5,578,142 | A * | 11/1996 | Hattori et al. ............ | 136/251 |
| 2004/0144420 | A1 | 7/2004 | Takeyama et al. | |
| 2004/0214980 | A1* | 10/2004 | Pourreau et al. ........... | 528/85 |
| 2005/0065310 | A1* | 3/2005 | Wang et al. ............... | 528/44 |
| 2005/0123781 | A1 | 6/2005 | Drescher et al. | |
| 2006/0207646 | A1 | 9/2006 | Terreau et al. | |
| 2008/0290324 | A1* | 11/2008 | Louwet et al. ............ | 252/500 |
| 2009/0069465 | A1 | 3/2009 | Austrup et al. | |
| 2010/0229945 | A1 | 9/2010 | Suzuta et al. | |

FOREIGN PATENT DOCUMENTS

| | | |
|---|---|---|
| JP | 60255861 | 12/1985 |
| JP | 4106118 | 4/1992 |
| JP | 7010957 | 2/1995 |
| JP | 1998017640 | 1/1998 |
| JP | 2001114858 | 2/2001 |
| JP | 2004067958 | 3/2004 |
| WO | 0118071 | 1/2001 |
| WO | 2010101811 | 9/2010 |

OTHER PUBLICATIONS

Takenaka, et al., "Low-cost amorphous silicon photovoltaic module encapsulated with liquid resin", Solar Energy Materials and Solar Cells, vol. 49, pp. 127-133, (1997).

Kapoor, et al., "Fabrication and characterization of polyester and acrylic polyurethane optical waveguides", Applied Optics, vol. 28, No. 1, pp. 37-39, (1989).

* cited by examiner

*Primary Examiner* — Olik Chaudhuri
*Assistant Examiner* — Wilner Jean Baptiste
(74) *Attorney, Agent, or Firm* — Kenneth Crimaldi

(57) ABSTRACT

A method for producing a photovoltaic module by contacting at least one layer of liquid encapsulant and a plurality of solar cells. The liquid encapsulant has two components. The first component is an acrylic polyol having a terminal hydroxy group, an average number of hydroxy-functional monomer units per polymer chain from 2 to 25 and Mn from 1,000 to 10,000. The second component is an aliphatic polyisocyanate with an average functionality of at least two. The molar ratio of non-terminal hydroxy groups in the polyol to isocyanate groups in the aliphatic polyisocyanate is from 0.5:1 to 1:0.5.

5 Claims, No Drawings

METHOD FOR PRODUCING A PHOTOVOLTAIC MODULE

This application claims the benefit of priority under 35 U.S.C. §119(e) of U.S. Provisional Patent Application No. 61/335,805 filed on Jan. 12, 2010.

This invention relates to a liquid encapsulant particularly useful for construction of photovoltaic modules and to a process for producing a photovoltaic module.

Methods have been disclosed for encapsulation of solar cells into a photovoltaic module. For example, U.S. Pub. No. 2006/0207646 discloses a process using a liquid silicone encapsulant. However, use of acrylic-urethane resins for this purpose has not been reported.

The problem addressed by the present invention is to provide a liquid encapsulant particularly useful for construction of photovoltaic modules and a process for producing a photovoltaic module.

STATEMENT OF INVENTION

The present invention provides a method for producing a photovoltaic module comprising contacting at least one layer of liquid encapsulant and a plurality of solar cells; wherein the liquid encapsulant comprises: (i) an acrylic polyol having a terminal hydroxy group, an average number of hydroxy-functional monomer units per polymer chain from 2 to 25 and Mn from 1,000 to 10,000; and (ii) an aliphatic polyisocyanate with an average functionality of at least two; wherein a molar ratio of non-terminal hydroxy groups in the polyol to isocyanate groups in the aliphatic polyisocyanate is from 0.5:1 to 1:0.5.

The present invention is further directed to a composition comprising: (i) an acrylic polyol having a terminal hydroxy group, an average number of hydroxy-functional monomer units per polymer chain from 2 to 25 and Mn from 1,000 to 10,000; and (ii) an aliphatic polyisocyanate with an average functionality of at least two; wherein a molar ratio of non-terminal hydroxy groups in the polyol to isocyanate groups in the aliphatic polyisocyanate is from 0.5:1 to 1:0.5.

DETAILED DESCRIPTION

Percentages are weight percentages (wt %) and temperatures are in ° C., unless specified otherwise. Weight percentages of monomers are based on the total weight of monomers in the polymerization mixture. As used herein the term "(meth)acrylic" refers to acrylic or methacrylic, and "(meth)acrylate" refers to acrylate or methacrylate. The term "(meth)acrylamide" refers to acrylamide (AM) or methacrylamide (MAM). "Acrylic monomers" include acrylic acid (AA), methacrylic acid (MAA), esters of AA and MAA, itaconic acid (IA), crotonic acid (CA), acrylamide (AM), methacrylamide (MAM), and derivatives of AM and MAM, e.g., alkyl (meth)acrylamides. Esters of AA and MAA include, but are not limited to, alkyl, hydroxyalkyl, phosphoalkyl and sulfoalkyl esters, e.g., methyl methacrylate (MMA), ethyl methacrylate (EMA), butyl methacrylate (BMA), hydroxyethyl methacrylate (HEMA), hydroxyethyl acrylate (HEA), hydroxypropyl methacrylate (HPMA), hydroxybutyl acrylate (HBA), methyl acrylate (MA), ethyl acrylate (EA), butyl acrylate (BA), 2-ethylhexyl acrylate (EHA) and phosphoalkyl methacrylates (e.g., PEM).

The term "vinyl monomers" refers to monomers that contain a carbon-carbon double bond that is connected to a heteroatom such as nitrogen or oxygen. Examples of vinyl monomers include, but are not limited to, vinyl acetate, vinyl formamide, vinyl acetamide, vinyl pyrrolidone, vinyl caprolactam, and long chain vinyl alkanoates such as vinyl neodecanoate, and vinyl stearate.

A solar cell is a semiconductor used to generate electricity from light. Solar cells typically are made from semiconductor materials such as silicon (crystalline, polycrystalline or thin film), gallium arsenide, copper indium diselenide, cadmium telluride, copper indium gallium diselenide, and mixtures thereof. Solar cells may be in the form of wafers or thin films, the former being made by cutting from a crystal or casting and the latter deposited on a substrate or superstrate by sputtering or chemical vapor deposition (CVD).

The average number of hydroxy-functional monomer units per polymer chain is an average value calculated for the acrylic polyol from its values of Mn and equivalent weight (EW) (units/chain=Mn/EW). The equivalent weight is defined as the mass of polyol which contains one mole of hydroxyl functionality, excluding hydroxy end groups. For example, a polyol containing 15 wt % HEMA has EW=876.6 g polyol/mole OH. If the hydroxyl number (OH#) has been determined for the polyol, then the calculation is as follows: Mn/(56105/OH#). The hydroxyl number is calculated from the hydroxy-functional monomer content of the polymer, without including the hydroxy end group believed to be derived from the chain transfer agent. OH#=56105/EW. The actual distribution of polymer chains will of course contain some chains with lower and higher hydroxyl functionality. In some embodiments of the invention, the average hydroxyl functionality per polymer chain is at least 2.5, preferably at least 3, preferably at least 3.5, preferably at least 4; the average hydroxyl functionality is no greater than 10, preferably no greater than 8, preferably no greater than 7, preferably no greater than 6.

In some embodiments of the invention, Mn of the acrylic polyol is a least 2,000, preferably at least 2,500, preferably at least 3,000, preferably at least 3,500. In some embodiments of the invention, Mn of the acrylic polyol is no greater than 8,000, preferably no greater than 7,000, preferably no greater than 6,000. In some embodiments Mw/Mn is from 1.5 to 3.5, alternatively from 2 to 3. In some embodiments of the invention, the Tg of the acrylic polyol is from −100° C. to −40° C., preferably from −80° C. to −45° C., preferably from −75° C. to −50° C.

In some embodiments of the invention, the acrylic polyol comprises at least 60% polymerized residues of acrylic monomers, preferably at least 70%, preferably at least 80%, preferably at least 90%, preferably at least 95%. In some embodiments of the invention, the acrylic polyol contains from 5 to 35% polymerized residues of hydroxy-containing acrylic monomers, preferably from 8 to 25%, preferably from 10 to 20%. In some embodiments of the invention, the acrylic polyol has Mn from 3,000 to 5,000 and from 10 to 20% residues of hydroxy-containing acrylic monomers. In some embodiments, hydroxy-containing monomers are hydroxyalkyl(meth)acrylates, preferably those selected from HEMA, HPMA, HBA or combinations thereof; preferably HEMA and/or HPMA. In some embodiments, the acrylic polyol comprises from 65 to 95% polymerized residues of $C_4$-$C_{12}$ alkyl(meth)acrylate(s), preferably from 75 to 92%, preferably from 80 to 90%; in some embodiments, the $C_4$-$C_{12}$ alkyl(meth)acrylate(s) are $C_4$-$C_{12}$ alkyl acrylate(s), preferably $C_4$-$C_{10}$ alkyl acrylate(s), preferably BA and/or EHA. In some embodiments, the acrylic polyol may contain small amounts of residues of vinyl monomers in addition to acrylic monomers.

Preferably, the acrylic polyol is made by a solution polymerization using typical initiators well known in the art.

Preferably, a chain transfer agent (CTA) is used, e.g., an alcohol, glycol, glycol alkyl ether, mercapto-alcohol or mercapto-glycol; preferably an alcohol, glycol or glycol alkyl ether; preferably an alcohol. In some embodiments, the chain transfer agent is substantially free (i.e., less than 0.3%, alternatively less than 0.1%, alternatively less than 0.05%) of sulfur and the acrylic polyol is substantially free (i.e., less than 100 ppm, alternatively less than 50 ppm, alternatively less than 25 ppm) of sulfur. Suitable solvents for the polymerization include, e.g., alcohols, alkyl esters, glycols, glycol alkyl ethers, aldehydes, ketones and ethers. In some embodiments, the solvent also acts as the chain transfer agent; preferred solvents which are also chain transfer agents include, e.g., $C_1$-$C_6$ alcohols, including isopropanol. When hydroxy compounds are used as chain transfer agents, a terminal hydroxy group is believed to be attached directly to the end of the polymer chain. When alcohols, e.g., isopropanol, are used as chain transfer agents, the resulting tertiary terminal hydroxy group is believed to be chemically less reactive than hydroxy groups on hydroxyalkyl(meth)acrylates and other hydroxy-substituted monomers.

An aliphatic polyisocyanate is a material having an average isocyanate functionality of at least 2. Examples of suitable aliphatic polyisocyanates include those based on isophorone diisocyanate (IPDI), hexamethylene diisocyanate (HDI), dicyclohexyl methane diisocyanate (HMDI), bis(isocyanatomethyl)cyclohexane, isomers thereof or mixtures thereof. Prepolymers of an aliphatic polyisocyanate and a polyol may also be used in this invention as the aliphatic polyisocyanate component; preferred Mn for a polyisocyanate prepolymer is from 300 to 3000, preferably from 500 to 2000. In some embodiments of the invention, the functionality of the aliphatic polyisocyanate is at least 2.5, alternatively at least 2.7, alternatively at least 3. In some embodiments, the aliphatic polyisocyanate has functionality no greater than 5, preferably no greater than 4, preferably no greater than 3.

Preferably, the molar ratio of non-terminal hydroxy groups/NCO groups varies from 0.75:1 to 1:0.75, alternatively from 0.75:1 to 1:0.9, alternatively from 0.9:1 to 1:0.75, alternatively from 0.9:1 to 1:0.9, alternatively from 0.95:1 to 1:0.9, alternatively from 0.9:1 to 1:0.95, alternatively from 0.95:1 to 1:0.95, alternatively 0.98:1 to 1:0.98, alternatively 0.99:1 to 1:0.99, alternatively 0.995:1 to 1:0.995.

Crosslinkers are monomers having two or more ethylenically unsaturated groups, and may include, e.g., divinylaromatic compounds, di-, tri- and tetra-(meth)acrylate esters, di-, tri- and tetra-allyl ether or ester compounds and allyl(meth) acrylate. Preferred examples of such monomers include divinylbenzene (DVB), trimethylolpropane diallyl ether, tetraallyl pentaerythritol, triallyl pentaerythritol, diallyl pentaerythritol, diallyl phthalate, diallyl maleate, triallyl cyanurate, Bisphenol A diallyl ether, allyl sucroses, methylene bisacrylamide, trimethylolpropane triacrylate, allyl methacrylate (ALMA), ethylene glycol dimethacrylate (EGDMA), hexane-1,6-diol diacrylate (HDDA) and butylene glycol dimethacrylate (BGDMA). In some embodiments of the invention, the amount of polymerized crosslinker residue in the polymer is no more than 0.2%, preferably no more than 0.1%, preferably no more than 0.05%, preferably no more than 0.02%.

The composition of the present invention optionally may include other ingredients. For example, the composition may include catalyst for the urethane forming reaction, e.g., dialkyl tin diesters; adhesion promoters; antioxidants and light stabilizers. The aforementioned ingredients preferably would be in the polyol component, although some may be included in the polyisocyanate component if they are not reactive with isocyanate groups and do not catalyze isocyanate polymerization. In some embodiments of the invention, the composition contains no more than 1.5 wt % light stabilizer(s), alternatively no more than 1.25%, alternatively no more than 1%, alternatively no more than 0.75%, alternatively no more than 0.5%, alternatively no more than 0.25%. In some embodiments of the invention, the photovoltaic module is formed using only the encapsulant and the solar cells to form a cured encapsulant in which the solar cells are suspended. In some embodiments of the invention, the photovoltaic module is formed by laminating two flexible sheets of material together using the liquid encapsulant; in this case the cells may be formed either on the bottom side of the top film, or the top side of the bottom film. In some further embodiments of the invention, these two flexible films are laminated in a roll-to-roll process. In some embodiments of the invention, a glass sheet covers the solar cells to form a photovoltaic module in which light passes through the glass sheet before striking the solar cells. In these embodiments, the solar cells may be separated from the glass by a layer of cured encapsulant material or the solar cells may be formed directly on the glass sheet (e.g., by sputtering or CVD) and then covered with a layer of the encapsulant material. When the solar cells are separated from the glass by a layer of cured encapsulant material, they may be formed on top of a solid sheet, e.g., of metal foil or glass, then covered with a layer of liquid encapsulant, and finally with a glass sheet; alternatively, the solar cells may be located between two layers of encapsulant with the glass on top, and an optional layer of rigid material below the layers of encapsulant. The rigid material may be, e.g., glass, a synthetic polymer (e.g., polyvinyl fluoride, polyethylene terephthalate, ethylene vinyl acetate), a metal sheet, etc. In these descriptions, the term "top" indicates the direction from which light travels to reach the solar cells. In most cases, the photovoltaic module requires an insulating material below the solar cells. This material may be the encapsulant or a rigid material, provided that the material meets criteria for insulating ability, e.g., test methods specified in IEC 61215, IEC 61646, UL 746A, UL746B, UL 746C.

In some embodiments of the invention, the polyol component and the isocyanate component are mixed to form the liquid encapsulant just prior to contact with the solar cells, e.g., in an in-line mixer or in a mixing tank. Depending on the type of construction of the photovoltaic module, as described above, the mixed components could be applied to glass or a synthetic polymer material prior to adding the solar cells, prior to and after the solar cells to form two layers of encapsulant material, to solar cells formed on glass or a synthetic polymer, etc. Preferably, the liquid encapsulant is cured by heating the assembled photovoltaic module, preferably to a temperature from 60° C. to 150° C. for a time from 1 minute to 3 hours. Times and temperatures will vary depending on the types of isocyanate and hydroxy functionality, hydroxy/isocyanate ratio and other factors, as is well understood in this field.

EXAMPLES

Typical Polymerization Procedure

Isopropanol (1137 g) was charged to a 4-neck, round-bottom flask fitted with nitrogen purge, reflux condenser, temperature controller, and mechanical stirrer, and heated to 82° C. A solution of t-amyl peroxypivalate in isopropanol was added (704 mL, 4.7 wt %), followed by a mixture of 2-ethylhexyl acrylate (187 g) and hydroxyethyl methacrylate (33 g). The temperature of the mixture increased to 86° C. without added heat. After allowing the mixture to cool to 82° C., a mixture of 2-ethylhexyl acrylate (1683 g) and hydroxyethyl methacrylate (297 g) was gradually added over a period of 180 minutes. Concurrently, a solution of t-amyl peroxypivalate in isopropanol (704 mL, 4.7 wt %) was added over a period of 200 minutes. After complete addition, the mixture was maintained at 82° C. for 60 minutes, followed by addition of a solution of t-amyl peroxypivalate in isopropanol (16.6 mL, 29.8 wt %). After 15 minutes, another solution of t-amyl peroxypivalate in isopropanol (16.6 mL, 29.8 wt %) was added over period of 90 minutes. The solvent was removed from the polymer by evaporation.

The following table lists polymers made according to this method.

was added and the formulation was mixed under vacuum for 3 minutes. The first three (or two, if no photopackage) ingredients were degassed at 60° C., and the isocyanate was pumped separately at a stoichiometric ratio into an in-line static mixer with 24 mixing elements.

1) Glass Down, Precure

The mixture described above was coated onto a 6"×6"glass plate using a drawdown bar, resulting in wet coating thickness of 500 microns. This plate was placed in an oven at 90 C for 1 hour. Subsequently, a second coating of the liquid encapsulant was made over this partially cured layer. A 5" (12.7 cm) single crystal silicon solar cell with front and rear bus ribbons was placed face down on the wet encapsulant, and a third coating made over the backside of the solar cell. An EVA/

| Composition | CTA | solv. | Eq. wt. (g/mol)- no eg | Mw | Mn | OH# | OH/ chain (no eg) |
|---|---|---|---|---|---|---|---|
| 94 BA/6 HEMA | MMP (4.0%) | EAc | 2169 | 5.8 | 2.2 | 25.9 | 1.0 |
| 95 BA/5 HEMA | ME (2.0%) | EAc | 2602.8 | 7.7 | 2.6 | 21.6 | 1.0 |
| 95 BA/5 HEMA | ME (4.0%) | EAc | 2602.8 | 4.0 | 1.7 | 21.6 | 0.7 |
| 94 BA/6 HEMA | ME (1.0%) | EAc | 2169 | 16.3 | 9.4 | 25.9 | 4.3 |
| 94 BA/6 HEMA | ME (1.5%) | EAc | 2169 | 11.2 | 6.8 | 25.9 | 3.1 |
| 94 BA/6 HEMA | MMP (1.5%) | EAc | 2169 | 20.7 | 11.5 | 25.9 | 5.3 |
| 88 BA/12 HEMA | 1-thioglycerol (3.0%) | EAc | 1084.5 | 8.7 | 5.6 | 51.7 | 5.2 |
| 88 BA/12 HEMA | 2-mercapto-3-butanol (3.0%) | EAc | 1084.5 | 9.1 | 5.8 | 51.7 | 5.3 |
| 92 BA/8 HEMA | MMP (1.75%) | EAc | 1626.8 | 17.0 | 9.4 | 34.5 | 5.8 |
| 94 BA/6 HEMA | MMP (0.5%) | EAc | 2169 | 50.6 | 23.3 | 25.9 | 10.7 |
| 94 BA/6 HEMA | — | EAc | 2169 | 194.0 | 63.5 | 25.9 | 29.3 |
| 94 BA/6 HEMA | MMP (1.0%) | EAc | 2169 | 27.0 | 14.0 | 25.9 | 6.5 |
| 91.3 EHA/8.7 HEMA | MMP (3.0%) | EAc | 1495.9 | 6.9 | 3.3 | 37.5 | 2.2 |
| 91.3 EHA/8.7 HEMA | MMP (1.5%) | EAc | 1495.9 | 16.2 | 9.1 | 37.5 | 6.1 |
| 95.8 EHA/4.2 HEMA | MMP (0.5%) | EAc | 3098.6 | 33.2 | 15.0 | 18.1 | 4.8 |
| 76 EHA/24 HEMA | MMP (0.5%) | EAc | 542 | 39.7 | 17.2 | 103.5 | 31.7 |
| 97.8 EHA/2.2 HEMA | MMP (0.5%) | EAc | 6000 | 23.5 | 11.1 | 9.4 | 1.9 |
| 80 EHA/20 HEMA | MMP (0.5%) | EAc | 651 | 38.6 | 17.0 | 86.2 | 26.1 |
| 85 EHA/15 HEMA | MMP (0.5%) | EAc | 868 | 37.1 | 16.3 | 64.6 | 18.8 |
| 91.3 EHA/8.7 HEMA | MMP (1.5%) | EAc | 1496 | 14.0 | 6.0 | 37.5 | 4.0 |
| 76 EHA/24 HEMA | MMP (3.0%) | EAc | 542 | 7.6 | 5.2 | 103.5 | 9.6 |
| 80 EHA/20 HEMA | MMP (3.0%) | EAc | 651 | 7.8 | 4.1 | 86.2 | 6.3 |
| 70 EHA/30 HPMA | MMP (3.0%) | EAc | 481 | 11.1 | 6.2 | 116.7 | 12.9 |
| 76 EHA/24 HPMA | MMP (3.0%) | EAc | 601 | 11.1 | 4.5 | 93.4 | 7.5 |
| 88 BA/12 HEMA | IPA | IPA | 1085 | 15.0 | 5.9 | 51.7 | 5.4 |
| 80 EHA/20 HPMA | MMP (3.0%) | EAc | 721 | 9.2 | 4.3 | 77.8 | 6.0 |
| 85 EHA/15 HEMA | MMP (3.0%) | EAc | 868 | 7.6 | 4.0 | 64.6 | 4.6 |
| 88 BA/12 HEMA | MMP (3.0%) | EAc | 1085 | 9.3 | 4.4 | 51.7 | 4.1 |
| 80 EHA/20 HEMA | IPA | IPA | 651 | 16.6 | 6.3 | 86.2 | 9.7 |
| 88 EHA/12 HEMA | IPA | IPA | 1085 | 12.2 | 4.7 | 51.7 | 4.3 |
| 90 EHA/10 HEMA | IPA | IPA | 1301 | 11.9 | 4.7 | 43.1 | 3.6 |
| 85 EHA/15 HEMA | MMP (3.0%) | EAc | 868 | 4.9 | 2.5 | 64.6 | 2.9 |
| 85 EHA/15 HEMA | MMP (1.5%) | EAc | 868 | 9.4 | 3.1 | 64.6 | 3.6 |
| 85 EHA/15 HEMA | IPA | IPA | 868 | 9.4 | 4.5 | 64.6 | 5.2 |
| 80 EHA/20 HPMA | IPA | IPA | 721 | 13.9 | 4.4 | 77.8 | 6.1 |
| 88 EHA/12 HPMA | IPA | IPA | 1201 | 10.9 | 3.6 | 46.7 | 3.0 |
| 100 EHA | IPA | IPA | — | 6.8 | 3.4 | — | — |

Mw and Mn listed in kg/mol;
eg = polymer end group
EAc = ethyl acetate;
MMP = methyl 3-mercaptopropionate;
IPA = isopropanol;
ME = mercaptoethanol Typical Procedure for Encapsulation This procedure is for an EHA/HEMA 85/15 copolymer crosslinked with a stoichiometric amount of HMDI (1:1 hydroxy/isocyanate molar ratio, based on hydroxy functionality of polyol excluding hydroxy end group). The copolymer (50 g, OH#64.5 mg KOH/g), catalyst (dibutyltin diacetate, 0.005 wt %, 0.0025 g), and optional photostabilizer were mixed under vacuum at 60° C. until no bubbles were observed. Dicyclohexylmethane-4,4'-diisocyanate (7.62 g)

PET/TEDLAR backsheet film was placed EVA side down on the wet encapsulant, and any air bubbles removed using a rubber roller. The laid-up solar module was placed in an oven and cured overnight at 90 C.

2) Glass Down, No Precure

The mixture described above was coated onto a 6"×6" (15.2×15.2 cm) glass plate using a drawdown bar. A 5" (12.7 cm) single crystal silicon solar cell with front and rear bus ribbons was placed face down on the wet encapsulant, and a second coating of liquid encapsulant made over the backside of the solar cell. An EVA/PET/TEDLAR backsheet film was placed on the wet encapsulant, and any air bubbles removed using a rubber roller. The laid-up solar module was placed in an oven and cured overnight at 90 C. In several modules, the backsheet was found to have partially slid off the glass.

3) Glass Down, No Precure; Fixture

The mixture described above was coated onto a 6"×6" (15.2×15.2 cm) glass plate using a drawdown bar. This glass plate was placed into an aluminum fixture which is sized to fit the glass and backsheet. The parts of the fixture which touch the workpiece are treated with fluoropolymer release agent. A 5" (12.7 cm) single crystal silicon solar cell with front and rear bus ribbons was placed face down on the wet encapsulant, and a second coating of liquid encapsulant made over the backside of the solar cell. An EVA/PET/TEDLAR backsheet film was placed on the wet encapsulant, and any air bubbles removed using a rubber roller. The laid-up solar module was placed in an oven and cured overnight at 90 C. After curing, the module was removed from the aluminum fixture.

4) Glass Up, No Precure, Fixture

The mixture described above was coated onto a 6"×6" (15.2×15.2 cm) piece of EVA/PET/TEDLAR backsheet film using a drawdown bar. A 5" (12.7 cm) single crystal silicon solar cell with front and rear bus ribbons was placed face up on the wet encapsulant. A second layer of encapsulant was coated over the solar cell, and a 6"×6" (15.2×15.2 cm) piece of glass laid on top slowly from one edge so no bubbles were trapped. This layup was transferred to an aluminum fixture, and the assembly cured in an oven overnight at 90 C. After curing, the module was removed from the aluminum fixture.

5) Predicted Procedure for Hot Glass

The mixture described above is coated onto a 6"×6" (15.2×15.2 cm) piece of glass which is preheated to 12° C. A 5" (12.7 cm) single crystal silicon solar cell with front and rear bus ribbons is placed face down on the wet encapsulant, and a second coating of liquid encapsulant is made over the backside of the solar cell. An EVA/PET/TEDLAR backsheet film is placed on the wet encapsulant, and any air bubbles removed using a rubber roller. The laid-up solar module is placed in an oven and cured overnight at 90 C.

6) Predicted Procedure for Use of Frame as Fixture

The mixture described above is coated onto a 6"×6" (15.2×15.2 cm) glass plate using a drawdown bar. A 5" (12.7 cm) single crystal silicon solar cell with front and rear bus ribbons is placed face down on the wet encapsulant, and a second coating of liquid encapsulant made over the backside of the solar cell. An EVA/PET/TEDLAR backsheet film with openings cut for the egress of the bus ribbons was placed on the wet encapsulant, and any air bubbles removed using a rubber roller. The laid-up solar module was placed into an aluminum frame, and additional mixture added to the edge of the frame to seal the frame to the module. The framed module is then placed in an oven and cured overnight at 90 C.

The following table lists test results from photovoltaic modules made without photostabilizer according to the above procedure. The polyol made using IPA as CTA is believed to have a hydroxy end group. Encapsulant polymer made from this polyol and HMDI exhibited much less yellowing than the comparison polymer. Yellowing was measured after the exposure to a Xe arc lamp for the indicated times, according to ASTM G 155.

| polyol | solvent/CTA | NCO | Yl (0 h) | Yl (500 h) | Yl (1000 h) |
|---|---|---|---|---|---|
| 85 EHA/15 HEMA | EAc/3% MMP | HMDI | 1.8 | 7.0 | 10.0 |
|  | IPA |  | 1.2 | 1.5 | 2.0 |

The invention claimed is:

1. A method for producing a photovoltaic module; said method comprising contacting at least one layer of liquid encapsulant and a plurality of solar cells; wherein the liquid encapsulant comprises: (i) an acrylic polyol having a terminal hydroxy group, an average number of hydroxy-functional monomer units per polymer chain from 2 to 25, Mn from 1,000 to 10,000, Tg from $-100°$ C. to $-40°$ C. and comprising from 65 to 95 wt % polymerized residues of $C_4$-$C_{12}$ alkyl (meth)acrylate and 5 to 35 wt % polymerized residues of hydroxy-containing acrylic monomer; and (ii) an aliphatic polyisocyanate with an average functionality of at least two; wherein a molar ratio of non-terminal hydroxy groups in the polyol to isocyanate groups in the aliphatic polyisocyanate is from 0.5:1 to 1:0.5.

2. The method of claim 1 in which the acrylic polyol has an average number of hydroxy-functional monomer units per polymer chain from 3 to 6.

3. The method of claim 2 in which the acrylic polyol has Mn from 3,000 to 5,000 and from 10 to 20% residues of hydroxy-containing acrylic monomer.

4. The method of claim 1 in which the acrylic polyol has Mn from 3,000 to 7,000.

5. The method of claim 1 in which the aliphatic polyisocyanate has an average functionality from 2 to 4.

* * * * *